(12) United States Patent
Isichei (10) Patent No.: US 10,891,407 B2
(45) Date of Patent: Jan. 12, 2021

(54) SYSTEM AND METHOD FOR AUTOMATED-INFLOW CONTROL DEVICE DESIGN

(71) Applicant: Saudi Arabian Oil Company, Dhahran (SA)

(72) Inventor: Obiomalotaoso Leonard Isichei, Al-Rakkah (SA)

(73) Assignee: SAUDI ARABIAN OIL COMPANY

( * ) Notice: Subject to any disclaimer, the term of this patent is extended or adjusted under 35 U.S.C. 154(b) by 859 days.

(21) Appl. No.: 15/471,498

(22) Filed: Mar. 28, 2017

(65) Prior Publication Data

US 2018/0285515 A1    Oct. 4, 2018

(51) Int. Cl.

| | |
|---|---|
| *G06F 30/17* | (2020.01) |
| *E21B 49/00* | (2006.01) |
| *E21B 47/06* | (2012.01) |
| *E21B 43/12* | (2006.01) |
| *E21B 47/07* | (2012.01) |
| *E21B 34/06* | (2006.01) |

(52) U.S. Cl.
CPC .......... *G06F 30/17* (2020.01); *E21B 43/12* (2013.01); *E21B 47/06* (2013.01); *E21B 47/07* (2020.05); *E21B 49/00* (2013.01); *E21B 34/06* (2013.01)

(58) Field of Classification Search
CPC .......... G06F 30/17; E21B 43/12; E21B 47/06; E21B 47/065; E21B 49/00; E21B 34/06
USPC .......................................................... 703/7
See application file for complete search history.

(56) References Cited

U.S. PATENT DOCUMENTS

| | | |
|---|---|---|
| 7,185,706 B2 | 3/2007 | Freyer |
| 8,025,072 B2 | 9/2011 | Atkinson et al. |
| 8,249,844 B2 | 8/2012 | Dale et al. |

(Continued)

FOREIGN PATENT DOCUMENTS

| | | |
|---|---|---|
| WO | 2015073032 A1 | 5/2015 |
| WO | 2017023278 A1 | 2/2017 |

OTHER PUBLICATIONS

Chaundary_2016 (Detecting and Removing Outlier in Producttion Data to Enhance Production Forecasting, SPE-179958-MS 2016) (Year: 2016).*
Subsurface_Maps_2016 ( Subsurface maps from AAPG Wiki dated 2016 downloaded from https://wiki.aapg.org/subsurface_maps 2016) (Year: 2016).*

(Continued)

*Primary Examiner* — Brian S Cook
(74) *Attorney, Agent, or Firm* — Bracewell LLP; Constance Gall Rhebergen (57) ABSTRACT

Embodiments provide a system and method for designing automated inflow control devices used in the extraction of hydrocarbons from subterranean formations. The system includes real-time data processing module configured to gather and process well data, the well data comprising logging while drilling data and user inputted data, and an intelligent field restriction module configured to generate one or more optimized inflow control device designs based on the well data gathered and processed by the real-time data processing module. The system further includes an inflow control design module configured to couple the one or more optimized inflow control device designs from the intelligent field restriction module with one or more scenarios to create a set of ranked optimized inflow control device designs, from which a user selects a preferred optimized inflow control device design based on well optimization goals defined in the user inputted data.

18 Claims, 3 Drawing Sheets

(56) References Cited

U.S. PATENT DOCUMENTS

| | | |
|---|---|---|
| 8,260,595 B2 | 9/2012 | Akram |
| 8,301,425 B2 | 10/2012 | Dale et al. |
| 8,875,797 B2 | 11/2014 | Haavard et al. |
| 9,341,060 B2 | 5/2016 | Banian et al. |
| 9,341,557 B2 | 5/2016 | Banian et al. |
| 2002/0049575 A1 | 4/2002 | Jalali et al. |
| 2002/0177955 A1 | 11/2002 | Jalali et al. |
| 2008/0041588 A1 | 2/2008 | Richards et al. |
| 2009/0216508 A1 | 8/2009 | Dale et al. |
| 2011/0011595 A1 | 1/2011 | Huang et al. |
| 2012/0278053 A1 | 11/2012 | Garcia et al. |
| 2013/0110486 A1* | 5/2013 | Polyakov ............. E21B 49/00 703/10 |
| 2014/0262235 A1* | 9/2014 | Rashid ............. E21B 43/12 166/250.01 |
| 2015/0000900 A1 | 1/2015 | O'Malley |
| 2015/0370934 A1* | 12/2015 | Pride ............. E21B 47/00 703/10 |
| 2017/0309094 A1* | 10/2017 | Farahat ............. G06Q 10/06 |

OTHER PUBLICATIONS

Gap_2015 (GAP Brochure, multiphase network modelling and optimization Oct. 24, 2015 downloaded from www.petex.com/products/ipm-suite/gap). (Year: 2015).*

PEH (Petroleum Engineering Handbook Larry W. Lake 2007 Society of Petroleum Engineers). (Year: 2007).*

Chaudhary_2016 (Detecting and Removing Outliers in Production Data to Enhance Production Forecasting, SPE-179958-MS 2016) (Year: 2016).*

Zeng_2016 (A Novel Autonomous InFlow Control Device Design: Improvements to Hybrid ICD IPTC-17776-MA 2016) (Year: 2016).*

Li_2010 (Interpreting Horizontal Well Flow Profiles and Optimizing Well Performace by Downhole Temperature and Pressure Data, Dec. 2010 Texas A&M University) (Year: 2010).*

International Search Report and Written Opinion dated Jun. 13, 2018 for corresponding PCT/US2018/022391.

Sang, Guangsen, et al: "A Novel Autonomous Inflow Control Device Design Based on Water Swelling Rubber", SPE-170506-MS, IADC/SPE Asia Pacific Drilling Technology Conference, Bangkok, Thailand Aug. 25, 2014, pp. 25-27.

* cited by examiner

SYSTEM AND METHOD FOR AUTOMATED-INFLOW CONTROL DEVICE DESIGN

BACKGROUND

Field

Embodiments relate to a system and method for automated inflow control device design to be used in the extraction of hydrocarbons from subterranean formations.

Description of the Related Art

Wells are typically drilled to recover subsurface hydrocarbons. Before a well is drilled, engineers develop a well plan that indicates a well completion and identifies and arranges one or more flow control devices that are installed in the completion to control the flow of fluids throughout the well. An inflow control device (ICD) is designed in order to control pressure drops and flow rates in different zones of a well that produces hydrocarbons. The design involves gathering logging while drilling (LWD) data with systems that are not integrated in order to further aid in the acquisition of hydrocarbons from subsurface formations. This data can include structural data related to the well, fluid contact data, resistivity data, and other data related to the well being drilled.

Flow control devices can include, for example, passive devices, such as ICD's, and active devices, such as inflow control valves (ICVs) and autonomous inflow control devices (AICDs). These devices are often designed and set up in a well to control the flow of the well production. The design of these devices can include, for example, their position or depth along the wellbore, nozzle sizes and flow areas, packer locations, the number of ICDs or AICDs per compartments, and other information regarding the placement of ICD equipment. It is important to optimize the well plan and design of the flow control device associated with the well, because it can impact the well production and its capability to produce more hydrocarbons.

Reservoir simulators are used to develop well plans and flow control devices by modeling the structure and properties of the reservoir to help estimate a proper setup of a wellbore to optimize production. Overall well completions can be designed as well using reservoir simulators to optimize the well production and to customize the design to fit the well so that it meets certain criteria.

Seismic surveying can also help determine the best well plan and flow control device design. Normally gathering all the data associated with the well and surrounding wells can take an extended period of time. Given that fact, there is a need for a quick and efficient system, whereby an ICD design is generated automatically without burdening well drillers with gathering all of the information needed to generate a well completion manually.

SUMMARY

Embodiments provide a system and a method for automating a design of an inflow control device that use LWD data to generate an ICD configuration. The LWD data, including, but not limited to, permeability and water saturation, is automatically gathered when a target well is drilled to a target depth and used by the system to design an ICD configuration that optimizes the flow of the hydrocarbons. The system and the method, according to various embodiments, also account for trained historical performance data (e.g., oil, water, and gas rates) of nearby ICD completions and rank the various optimized scenarios based on objectives set by a user.

According to various embodiments, the ICD design helps to balance well production and inflow along the entire length of the wellbore. Users of such systems gather the input data manually to determine the optimal configuration of the ICD design. The various ICD configurations, according to various embodiments, are ranked and provided to a user who defines an objective for the ICD system, so that the installation of the ICD is optimized (i.e., optimized based on the flow rate and the pressure within the ICD).

Once the well is drilled to the target depth, the system, using an automated control design and optimization (AICDO), gathers LWD and formation data digitally and designs the ICD configuration automatically.

According to at least one embodiment, the system includes three modules that create a variety of ICD configurations based on passed well performance and nearby well data. The systems and methods can be incorporated in modules on one computer system or interact over a network that incorporate a processor and computer programmable media.

Embodiments of the invention provide a system and method for designing automated inflow control devices to be used in the extraction of hydrocarbons from subterranean formations. According to at least one embodiment, the system includes real-time data processing module configured to gather and process well data, the well data including logging while drilling data and user inputted data, and an intelligent field restriction module configured to generate one or more optimized inflow control device designs based on the well data gathered and processed by the real-time data processing module. The system further includes an inflow control design module configured to couple the one or more optimized inflow control device designs from the intelligent field restriction module with one or more scenarios to create a set of ranked optimized inflow control device designs, from which a user selects a preferred optimized inflow control device design based on well optimization goals defined in the user inputted data.

According to at least one embodiment, the real-time data processing module is configured to gather and process the well data, when a well is drilled to a target depth.

According to at least one embodiment, the logging while drilling data includes at least one of permeability, porosity, and water saturation, and the user inputted data includes at least one of historical performance data of nearby inflow control device completions, formation data associated with the well, and the temperature or the pressure of the well.

According to at least one embodiment, the formation data includes formation-type data including carbonate level and fracture level, high water cut, latest pressure contour maps, historical locations of fractures, historical number of packers deployed, productivity index of nearby wells, other measures of field knowledge of fluid properties and inflow performance information such as current reservoir pressure, pressure-volume-temperature information across the field, information related to the upper completion and other measures of nearby well information, such as heavy and light oil (all API types), carbonate formation, and sandstone formation.

According to at least one embodiment, the real-time data processing module is further configured to compare pressure readings from the well with one or more predefined pressure correlations, such as Murkerjee Brill, Beggs and Brill, and Hagerdon Brown, and further configured to calibrate the pressure within the well for maintaining a predefined pressure gradient.

According to at least one embodiment, the real-time data processing module is further configured to fill one or more data gaps in the logging while drilling data based on the user inputted data.

According to at least one embodiment, the real-time data processing module is further configured to filter out outliers in the logging while drilling data through pre-processing and further configured to send the logging while drilling data to the inflow control design module.

According to at least one embodiment, when the inflow control design module creates the set of ranked optimized inflow control device designs, the inflow control design module is further configured to incorporate packers used in the well in the ranked optimized inflow control device designs, based on the logging while drilling data and the user inputted data.

According to at least one embodiment, the inflow control design module is further configured to incorporate an effect of field network back pressure into the set of ranked optimized inflow control device designs to prevent restriction of the well's performance.

According to another embodiment, there is provided a method for automating a design of an inflow control device, the method including gathering and processing, using a real-time data processing module, well data, the well data including logging while drilling data and user inputted data, and generating, using an intelligent field restriction module, one or more optimized inflow control device designs based on the well data gathered and processed by the real-time data processing module. The method further includes coupling, using an inflow control design module, the one or more optimized inflow control device designs from the intelligent field restriction module with one or more scenarios to create a set of ranked optimized inflow control device designs, and displaying the set of ranked optimized inflow control device designs from which a user selects a preferred optimized inflow control device design based on well optimization goals defined in the user inputted data.

According to at least one embodiment, the gathering and processing of the well data, using the real-time data processing module, occurs when a well is drilled to a target depth.

According to at least one embodiment, the logging while drilling data includes at least one of permeability, porosity, and water saturation, and the user inputted data includes at least one of historical performance data of nearby inflow control device completions and formation data associated with the well.

According to at least one embodiment, the formation data includes formation-type data including carbonate level and fracture level, high water cut, latest pressure contour maps, historical locations of fractures, historical number of packers deployed, productivity index of nearby wells, other measures of field knowledge of fluid properties and inflow performance information such as current reservoir pressure, pressure-volume-temperature information across the field, information related to the upper completion and other measures of nearby well information.

According to at least one embodiment, the method further includes comparing pressure readings from the well, using the real-time data processing module, with one or more pressure correlations, and calibrating the pressure within the well for maintaining a predefined pressure gradient.

According to at least one embodiment, the method further includes filling one or more data gaps in the logging while drilling data, using the real-time data processing module, based on the user inputted data.

According to at least one embodiment, the method further includes filtering out outliers in the logging while drilling data, using the real-time data processing module, through pre-processing and sending the logging while drilling data to the inflow control design module.

According to at least one embodiment, when the set of ranked optimized inflow control device designs is created by the inflow control design module, the method further includes incorporating packers used in the well in the ranked optimized inflow control device designs occurs, based on the logging while drilling data and the user inputted data.

According to at least one embodiment, the method further includes incorporating an effect of field network back pressure into the set of ranked optimized inflow control device designs to prevent restriction of the well's performance.

BRIEF DESCRIPTION OF DRAWINGS

So that the manner in which the features and advantages of the method and system disclosed, as well as others which will become apparent, may be understood in more detail, a more particular description of the method and system briefly summarized previously may be had by reference to the embodiments thereof which are illustrated in the appended drawings, which form a part of this specification. It is to be noted, however, that the drawings illustrate only various embodiments and are therefore not to be considered limiting of the scope as it may include other effective embodiments as well. Like numbers refer to like elements throughout, and the prime notation, if used, indicates similar elements in alternative embodiments or positions.

DETAILED DESCRIPTION

Although the following detailed description contains many specific details for purposes of illustration, it is understood that one of ordinary skill in the art will appreciate that many examples, variations and alterations to the following details are within the scope and spirit. Accordingly, the various embodiments described and provided in the appended figures are set forth without any loss of generality, and without imposing limitations, relating to the claims.

Automatic Design of Inflow Control Device Design

Figure 1:
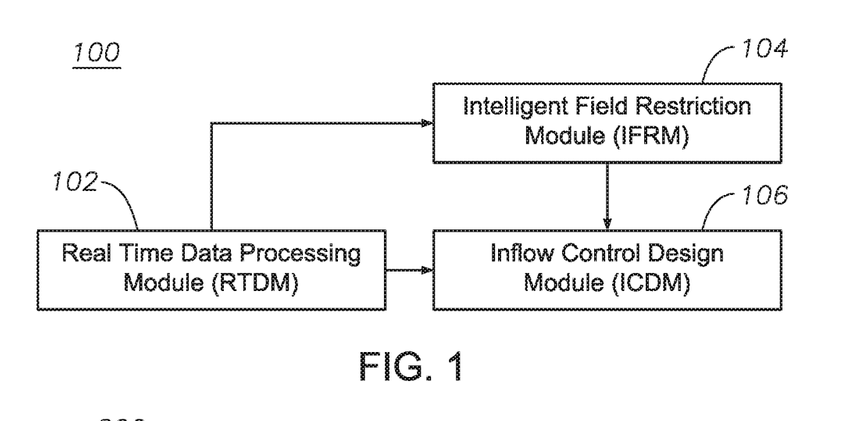
FIG. 1 is a schematic view of an embodiment of the invention.
Figure 2:
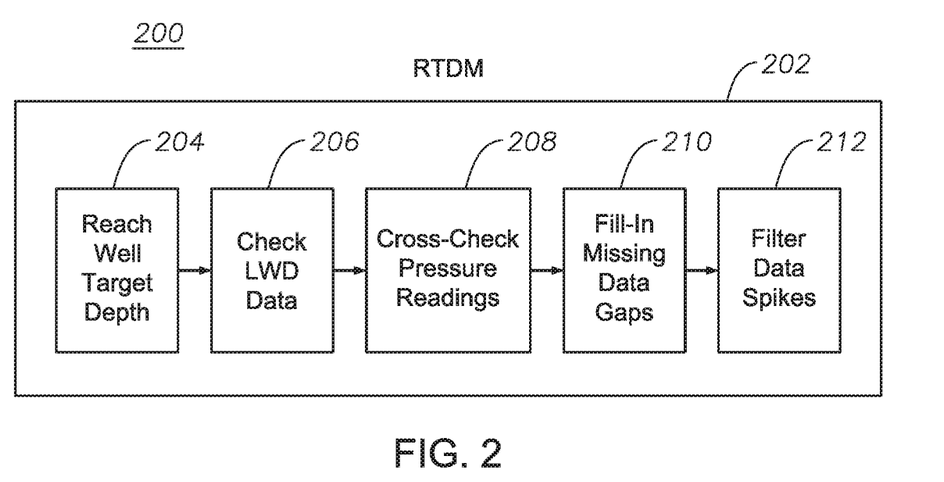
FIG. 2 is a flow chart showing how a real time data processing module, according to an embodiment, generates multiple ICD configurations.

Embodiments provide a method and system for generating an inflow device design, as generally shown in FIG. 1. As shown in FIG. 1, the ICD system 100 includes three modules: a Real Time Data Processing Module (RTDM) 102, an Intelligent Field Restriction Module (IFRM) 104, and an Inflow Control Design Module (ICDM) 106. FIG. 2 is a flow chart showing how a RTDM 202, according to an embodiment, generates multiple ICD configurations 200.

According to at least one embodiment, the RTDM 102, 202 may automatically gather data from one or more sensors located within the well and may process the data so it is properly logged and stored in a database. Data includes, for example, LWD data, such as permeability, porosity, and water saturation. Once the well reaches its target depth as shown in step 204 in FIG. 2, the system may automatically gather and check the LWD data in step 206 to make sure it is within an acceptable boundary of the field in question. For example, the system may determine whether the LWD data is within a predefined pressure profile and remove any LWD data outside of the predefined pressure profile. In certain embodiments, the RTDM 102, 202 in step 208 may check and calibrate the pressure readings measured within the well based on pressure correlations within the well to ensure that a pressure gradient within the well is within a predefined range. According to at least one embodiment, the RTDM 102, 202 may also automatically gather user inputted data, which defines predefined operating parameters, historical performance data or nearby inflow control device completions and formation data associated with the well.

Once the well is drilled to the target depth, the RTDM 102, 202 in step 210 may fill in one or more gaps in the data based on prior historical data inputted by the user or stored in a database that contains information about the well that is currently being drilled and other nearby wells, laterals and formations. This data, according to various embodiments, may be sent in step 212 through a pre-processing algorithm that will filter out any data spikes. After the RTDM 102, 202 gathers and checks the LWD data, the RTDM 102, 202 may send the data to the IFRM 104 for further processing.

Figure 3:
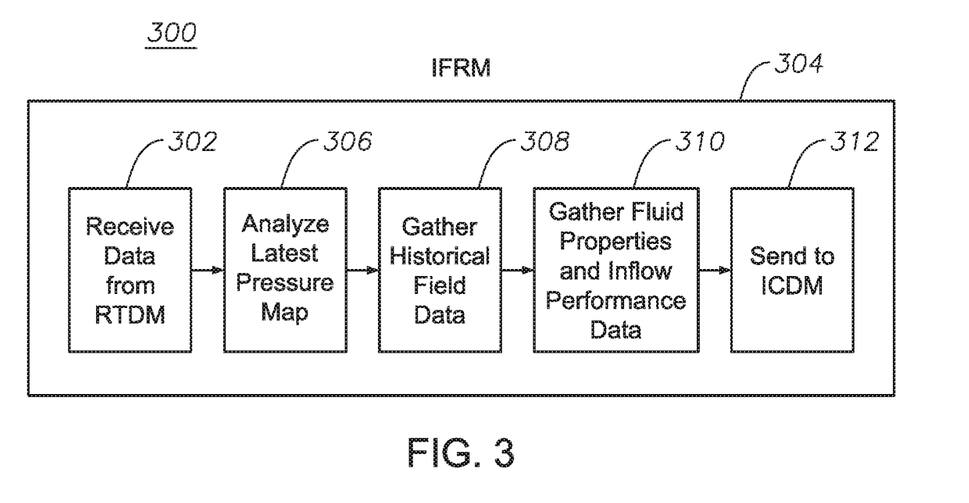
FIG. 3 is a flow chart showing how an intelligent field restriction module, according to an embodiment, generates multiple ICD configurations.

FIG. 3 is a flow chart showing how an IRFM 304, according to an embodiment, generates multiple ICD configurations 300.

According to at least one embodiment, the IFRM 104, 304 may in step 302 receive the LWD and user inputted data from the RTDM 102, 202 and may create a set of ranked optimized ICD designs. As mentioned above, various sensors can be arranged within the well and used to gather the LWD data and the user inputted data. The user inputted data may include, for example, formation type data including carbonate level and fracture level, high water cut, latest pressure contour maps, historical locations of fractures, historical number of packers deployed, productivity index of nearby wells, other measures of field knowledge of fluid properties and inflow performance information such as current reservoir pressure, pressure-volume-temperature information across the field, information related to the upper completion and other measures of nearby well information. According to at least one embodiment, the IFRM 104, 304 may ensure that the ICDM 106 will not over-restrict the well's performance and that the ICDs generated by the IFRM 104, 304 will comply with the past history of the ICDs from nearby wells. Further, the IFRM 104, according to various embodiments, may catalogue information regarding formation type and challenges of the particular formation type including carbonate and fracture information along with the water cut information of the particular well.

According to at least one embodiment, the IFRM 104, 304 in steps 306 and 308 may keep track of the latest pressure contour maps for the particular well being drilled and the historical data regarding nearby wells. Historical data may include, for example, fracture locations and a number of deployed packers. Further, nearby well information including, for example, pressure indexes may be stored and used by the IFRM 104, 304 to provide optimized ICD designs. The current reservoir pressure, and pressure-volume-temperature information across various sections of the field are other pieces of inflow performance information that may be used in step 310 to create the optimized configuration, along with nearby well information and upper completion information from the well completion.

According to at least one embodiment, the IFRM 104, 304 may generate optimized ICD designs based on formation type, layer, pressure, permeability, and other relevant reservoir information across every section of the field.

According to at least one embodiment, the ICDM 106 may receive in step 312 the one or more optimized inflow control device designs and may couple the parameters generated by the IFRM 104, 304 to certain scenarios that are optimized based on a user's desired goals (i.e., rate or pressure targets at the heel of the well). Further, the ICDM 106 may gather from the IFRM 104, 304 a set of clearly defined objectives and may optimize the multiple scenarios, so the user can select the best ICD design. According to some embodiments, this can include intelligent placement of packers based on the LWD data or image log data that has been automatically gathered by the RTDM 102, 202. This data includes, for example, permeability variations, image data relating to fractures, and historical packer placement and constraints given the formation. Further, the ICDM 106 according to various embodiments may optimize the scenarios based on historical information of the effect of the field network pressure, so that the ICD design does not over restrict the well's performance.

The ICD system 100 is an integrated system that simultaneously gathers LWD data, incorporates previous ICD completion performance, and simulates various ICD designs with different scenarios from the lower completion to the field network. Embodiments of the invention gather all of this field intelligence in flank and crest areas as well, in light of acceptable ICD restrictions. The restrictions define an acceptable ICD choking pressure drop in the flank and crest areas of the layer. For example, 20 psi in the flank and 40 psi in the crest.

Figure 4:
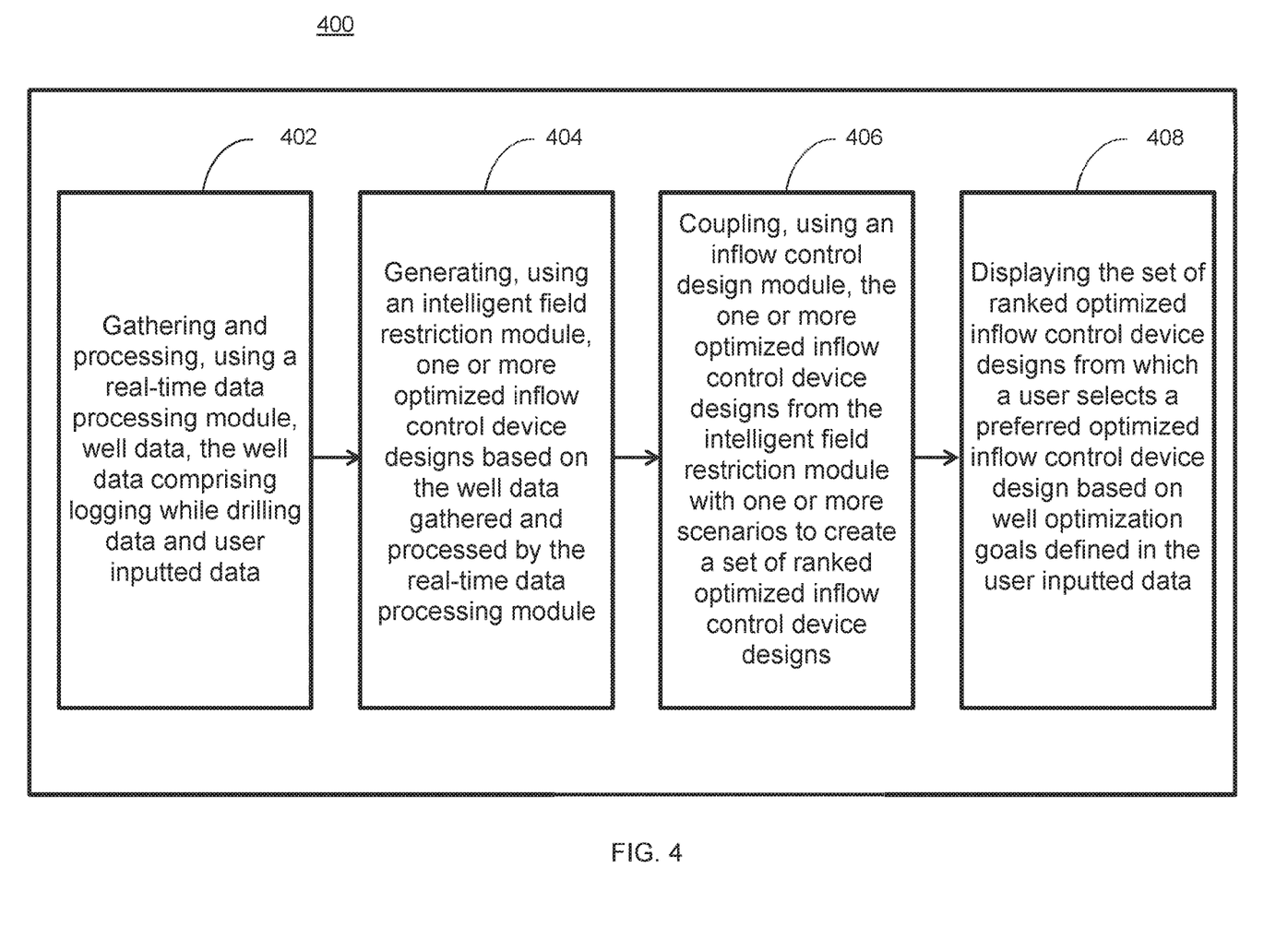
FIG. 4 is a flow chart showing how an inflow control design module, generates multiple ICD configurations.

FIG. 4 shows the operation of the ICDM system 400. In particular, in step 402, the ICDM system 400 may automatically gather and process, using the RTDM, well data, the well data including LWD data and user inputted data. Then in step 404, the system 400 generates, using the IFRM, one or more optimized inflow control device designs based on the well data gathered and processed by the RTDM. In step 406, the ICDM couples the one or more optimized inflow control device designs from the IFRM with one or more scenarios to create a set of ranked optimized inflow control device designs. After this step, in step 408 in FIG. 4, the ICDM system 400 displays the set of ranked optimized inflow control device designs from which a user selects a preferred optimized inflow control device design based on well optimization goals defined in the user inputted data. Configurations of the ICD take into account such information as flux balance and water cut reduction set by the user, as well as permeability, water saturation, and porosity.

Figure 5:
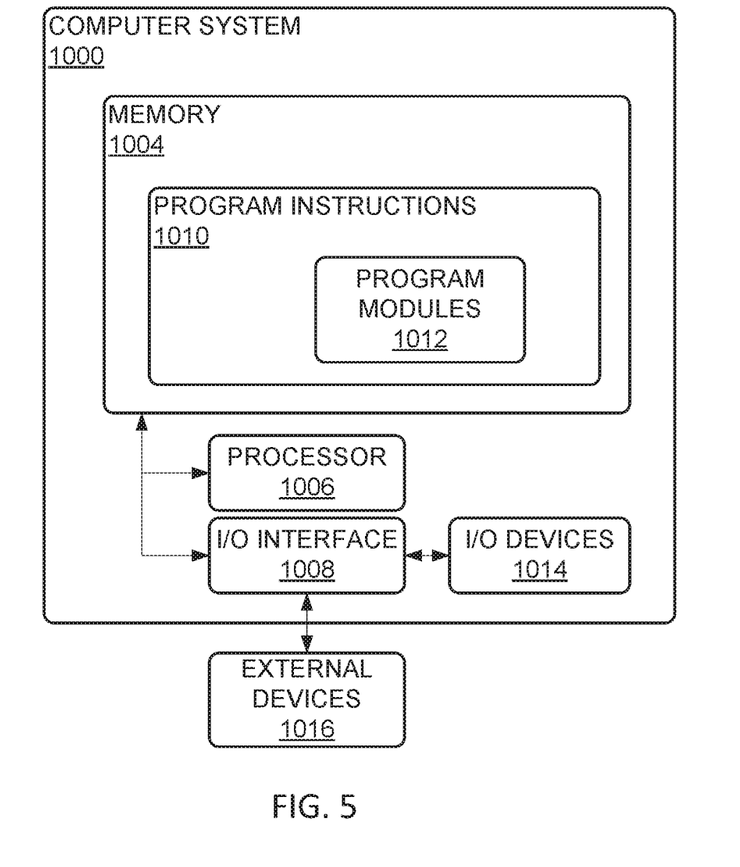
FIG. 5 is a diagram that illustrates an example computer system in accordance with one or more embodiments.

FIG. 5 is a diagram that illustrates an example computer system (or "system") 1000 in accordance with one or more embodiments. In some embodiments, the system 1000 is a programmable logic controller (PLC). The system 1000 may include a memory 1004, a processor 1006 and an input/output (I/O) interface 1008. The memory 1004 may include one or more of non-volatile memory (for example, flash memory, read-only memory (ROM), programmable read-only memory (PROM), erasable programmable read-only memory (EPROM), electrically erasable programmable read-only memory (EEPROM)), volatile memory (for example, random access memory (RAM), static random access memory (SRAM), synchronous dynamic RAM (SDRAM)), and bulk storage memory (for example, CD-ROM or DVD-ROM, hard drives). The memory 1004 may include a non-transitory computer-readable storage medium having program instructions 1010 stored thereon. The program instructions 1010 may include program modules 1012 that are executable by a computer processor (for example, the processor 1006) to cause the functional operations described, such as those described with regard to at least one or both of the ICD system 100 and the method 400.

According to at least one embodiment, the processor 1006 may be any suitable processor capable of executing program instructions. The processor 1006 may include a central processing unit (CPU) that carries out program instructions (for example, the program instructions of the program module(s) 1012) to perform the arithmetical, logical, and input/output operations described. The processor 1006 may include one or more processors. The I/O interface 1008 may provide an interface for communication with one or more I/O devices 1014, such as a joystick, a computer mouse, a keyboard, and a display screen (for example, an electronic display for displaying a graphical user interface (GUI)). The I/O devices 1014 may include one or more of the user input devices. The I/O devices 1014 may be connected to the I/O interface 1008 via a wired connection (for example, Industrial Ethernet connection) or a wireless connection (for example, Wi-Fi connection). The I/O interface 1008 may provide an interface for communication with one or more external devices 1016, such as other computers and networks. In some embodiments, the I/O interface 1008 includes one or both of an antenna and a transceiver. In some embodiments, the external devices 1016 include one or more user input device and down-hole sensors, as non-limiting examples.

Further modifications and alternative embodiments of various aspects of the disclosure will be apparent to those skilled in the art in view of this description. Accordingly, this description is to be construed as illustrative only and is for the purpose of teaching those skilled in the art the general manner of carrying out the embodiments. It is to be understood that the forms of the embodiments shown and described herein are to be taken as examples of embodiments. Elements and materials may be substituted for those illustrated and described herein, parts and processes may be reversed or omitted, and certain features of the embodiments may be utilized independently, all as would be apparent to one skilled in the art after having the benefit of this description of the embodiments. Changes may be made in the elements described herein without departing from the spirit and scope of the embodiments as described in the following claims. Headings used herein are for organizational purposes only and are not meant to be used to limit the scope of the description.

It will be appreciated that the processes and methods described herein are example embodiments of processes and methods that may be employed in accordance with the techniques described herein. The processes and methods may be modified to facilitate variations of their implementation and use. The order of the processes and methods and the operations provided therein may be changed, and various elements may be added, reordered, combined, omitted, modified, etc. Portions of the processes and methods may be implemented in software, hardware, or a combination thereof. Some or all of the portions of the processes and methods may be implemented by one or more of the processors/modules/applications described herein.

As used throughout this application, the word "may" is used in a permissive sense (i.e., meaning having the potential to), rather than the mandatory sense (i.e., meaning must). The words "include," "including," and "includes" mean including, but not limited to. As used throughout this application, the singular forms "a", "an," and "the" include plural referents unless the content clearly indicates otherwise. Thus, for example, reference to "an element" may include a combination of two or more elements. As used throughout this application, the phrase "based on" does not limit the associated operation to being solely based on a particular item. Thus, for example, processing "based on" data A may include processing based at least in part on data A and based at least in part on data B, unless the content clearly indicates otherwise. As used throughout this application, the term "from" does not limit the associated operation to being directly from. Thus, for example, receiving an item "from" an entity may include receiving an item directly from the entity or indirectly from the entity (for example, via an intermediary entity). Unless specifically stated otherwise, as apparent from the discussion, it is appreciated that throughout this specification discussions utilizing terms such as "gathering," "processing," "generating," "coupling," "displaying," or the like refer to actions or processes of a specific apparatus, such as a special purpose computer or a similar special purpose electronic processing/computing device. In the context of this specification, a special purpose computer or a similar special purpose electronic processing/computing device is capable of manipulating or transforming signals, typically represented as physical, electronic or magnetic quantities within memories, registers, or other information storage devices, transmission devices, or display devices of the special purpose computer or similar special purpose electronic processing/computing device.

The invention claimed is:

1. A system for automating a design of an inflow control device, the system comprising:
  a real-time data processing module configured to gather and process well data, the well data comprising logging while drilling data and user inputted data, wherein the real-time data processing module is configured to determine whether the logging while drilling data is within a predefined pressure profile, configured to remove any of the logging while drilling data outside of the predefined pressure profile, and configured to send the well data to an intelligent field restriction module;
  the intelligent field restriction module configured to generate one or more optimized inflow control device designs based on the well data gathered and processed by the real-time data processing module, wherein the intelligent field restriction module is configured to analyze latest pressure contour maps for a well being drilled, historical locations of fracture, and historical number of packers deployed in other wells, and configured to send the one or more optimized inflow control device designs to an inflow control design module; and
  the inflow control design module configured to couple the one or more optimized inflow control device designs from the intelligent field restriction module with one or more scenarios to create a set of ranked optimized inflow control device designs, from which a user selects a preferred optimized inflow control device design based on well optimization goals defined in the user inputted data, wherein the one or more scenarios are optimized based on a rate or pressure target at a heel of the well.

2. The system of claim 1, wherein the real-time data processing module is configured to gather and process the well data, when the well is drilled to a target depth.

3. The system of claim 1, wherein the logging while drilling data comprises at least one of permeability, relative permeability, porosity, and water saturation, and the user inputted data comprises at least one of historical performance data of other inflow control device completions and formation data associated with the well.

4. The system of claim 3, wherein the formation data comprises formation-type data including carbonate level and fracture level, high water cut, the latest pressure contour maps, the historical locations of fractures, the historical number of packers deployed, productivity index of other wells, other measures of field knowledge of fluid properties and inflow performance information including current reservoir pressure, pres sure-volume-temperature information across the field, information related to the upper completion and other measures of other well information including heavy and light oil (all API types), carbonate formation, and sandstone formation.

5. The system of claim 1, wherein the real-time data processing module is further configured to calibrate the pressure within the well for maintaining a predefined pressure gradient.

6. The system of claim 1, wherein the real-time data processing module is further configured to fill one or more data gaps in the logging while drilling data based on the user inputted data.

7. The system of claim 1, wherein the real-time data processing module is further configured to filter out outliers in the logging while drilling data through pre-processing and further configured to send the logging while drilling data to the inflow control design module.

8. The system of claim 1, wherein, when the inflow control design module creates the set of ranked optimized inflow control device designs, the inflow control design module is further configured to incorporate packers used in the well in the ranked optimized inflow control device designs, based on the logging while drilling data and the user inputted data.

9. The system of claim 1, wherein the inflow control design module is further configured to incorporate an effect of field network back pressure into the set of ranked optimized inflow control device designs to prevent restriction of the well's performance.

10. A method for automating a design of an inflow control device, the method comprising the steps of:
gathering and processing, using a real-time data processing module, well data, the well data comprising logging while drilling data and user inputted data, wherein the gathering and processing step further includes the steps of:
determining whether the logging while drilling data is within a predefined pressure profile; and
removing any of the logging while drilling data outside of the predefined pressure profile; and
sending the well data to an intelligent field restriction module;
generating, using the intelligent field restriction module, one or more optimized inflow control device designs based on the well data gathered and processed by the real-time data processing module, wherein the generating step further includes the steps of:
analyzing latest pressure contour maps for a well being drilled, historical locations of fractures, and historical number of packers deployed in other wells; and
sending the one or more optimized inflow control device designs to an inflow control design module;
coupling, using the inflow control design module, the one or more optimized inflow control device designs from the intelligent field restriction module with one or more scenarios to create a set of ranked optimized inflow control device designs, wherein the one or more scenarios are optimized based on a rate or pressure target at a heel of the well; and
displaying the set of ranked optimized inflow control device designs from which a user selects a preferred optimized inflow control device design based on well optimization goals defined in the user inputted data.

11. The method of claim 10, wherein the gathering and processing of the well data, using the real-time data processing module, occurs when the well is drilled to a target depth.

12. The method of claim 10, wherein the logging while drilling data comprises at least one of permeability, porosity, and water saturation, and the user inputted data comprises at least one of historical performance data of other inflow control device completions and formation data associated with the well.

13. The method of claim 12, wherein the formation data comprises formation-type data including carbonate level and fracture level, high water cut, latest pressure contour maps, historical locations of fractures, historical number of packers deployed, productivity index of other wells, other measures of field knowledge of fluid properties and inflow performance information including current reservoir pressure, pressure-volume-temperature information across the field, information related to the upper completion and other measures of other well information.

14. The method of claim 10, further comprising:
calibrating the pressure within the well for maintaining a predefined pressure gradient.

15. The method of claim 10, further comprising:
filling one or more data gaps in the logging while drilling data, using the real-time data processing module, based on the user inputted data.

16. The method of claim 10, further comprising:
filtering out outliers in the logging while drilling data, using the real-time data processing module, through pre-processing and sending the logging while drilling data to the inflow control design module.

17. The method of claim 10, wherein, when the set of ranked optimized inflow control device designs is created by the inflow control design module, the method further comprises:
incorporating packers used in the well in the ranked optimized inflow control device designs occurs, based on the logging while drilling data and the user inputted data.

18. The method of claim 10, further comprising:
incorporating an effect of field network back pressure into the set of ranked optimized inflow control device designs to prevent restriction of the well's performance.

* * * * *

UNITED STATES PATENT AND TRADEMARK OFFICE
CERTIFICATE OF CORRECTION

PATENT NO. : 10,891,407 B2
APPLICATION NO. : 15/471498
DATED : January 12, 2021
INVENTOR(S) : Obiomalotaoso Leonard Isichei It is certified that error appears in the above-identified patent and that said Letters Patent is hereby corrected as shown below:

In Claim 4, Column 9, Line 20, reads:
"ervoir pressure, pres sure-volume-temperature information"
It should read:
--ervoir pressure, pressure-volume-temperature information--.

Signed and Sealed this
Twenty-seventh Day of April, 2021

Drew Hirshfeld
*Performing the Functions and Duties of the
Under Secretary of Commerce for Intellectual Property and
Director of the United States Patent and Trademark Office*